US008995192B2

(12) United States Patent
Khouri et al.

(10) Patent No.: US 8,995,192 B2
(45) Date of Patent: Mar. 31, 2015

(54) METHOD OF PROGRAMMING SELECTION TRANSISTORS FOR NAND FLASH MEMORY

(75) Inventors: Osama Khouri, Bellano (IT); Simone Bartoli, Mandello Del Lario (IT)

(73) Assignee: PS4 Luxco S.a.r.l., Luxembourg (LU)

( * ) Notice: Subject to any disclaimer, the term of this patent is extended or adjusted under 35 U.S.C. 154(b) by 443 days.

(21) Appl. No.: 13/432,535

(22) Filed: Mar. 28, 2012

(65) Prior Publication Data

US 2013/0258780 A1   Oct. 3, 2013

(51) Int. Cl.
  *G11C 11/34* (2006.01)
  *G11C 16/04* (2006.01)
  *G11C 16/10* (2006.01)
  *G11C 16/34* (2006.01)
  *G11C 16/14* (2006.01)

(52) U.S. Cl.
  CPC .............. *G11C 16/04* (2013.01); *G11C 16/34* (2013.01); *G11C 16/0466* (2013.01); *G11C 16/10* (2013.01); *G11C 16/14* (2013.01)
  USPC ........... 365/185.17; 365/185.18; 365/185.22; 365/185.29

(58) Field of Classification Search
  CPC ........ G11C 16/10; G11C 16/04; G11C 16/14; G11C 16/0466; G11C 16/30; G11C 16/34
  USPC .............. 365/185.17, 185.18, 185.22, 185.29
  See application file for complete search history.

(56) References Cited

U.S. PATENT DOCUMENTS

| 2009/0027967 | A1 | 1/2009 | Lee | |
| 2011/0199829 | A1* | 8/2011 | Lee et al. | 365/185.17 |
| 2012/0044771 | A1* | 2/2012 | Joo | 365/185.22 |
| 2012/0195125 | A1* | 8/2012 | Choe et al. | 365/185.15 |

* cited by examiner

*Primary Examiner* — Toan Le

(57) ABSTRACT

Disclosed herein is a method that includes providing a non-volatile memory device which includes a plurality of cells, a plurality of selection transistors each having a gate and each coupled to associated one of the cells, and a selection line coupled in common to the gates of the selection transistors, applying a first program voltage to the selection line, and applying a second program voltage to the selection line when at least one of the selection transistors have not been shifted to a program condition.

2 Claims, 14 Drawing Sheets

METHOD OF PROGRAMMING SELECTION TRANSISTORS FOR NAND FLASH MEMORY

FIELD OF THE INVENTION

The present disclosure relates to an apparatus and a method of programming selection transistors for NAND flash memory.

The disclosure particularly, but not exclusively, relates to the method of programming selection transistors in NAND flash memory array, especially by precisely controlling the threshold voltage of the selection transistors themselves.

BACKGROUND OF THE INVENTION

In the last years, the memory market has been characterized by an increasing interest in high density devices and technology scaling has become more and more aggressive, both for memory core and circuitry, especially for the flash memory devices. While the technology is continuously improving to reduce the memory size, the scaling of standard NAND technologies has become more challenging due to parasitic effects which are relevant along with a more and more reduced cell pitch.

In a floating gate NAND flash memory, each cell transistor of the NAND flash memory comprises a floating gate which can selectively trap electrons for storing information. The floating gate is insulated from the well of the cell transistor by, e.g. oxide layer. To trap electrons into the floating gate, a programming operation is performed to a target cell. This programming operation may be performed, for example, by applying a high voltage to a gate terminal of the target cell and a ground voltage to a well or channel of the cell transistor. To remove or extract electrons being trapped in the floating gate, an erase operation is performed to the target cell. The erase operation may be performed, for example, by applying a high voltage to the well or channel of the cell transistor and a ground voltage to the gate terminal of the target cell. Usually, the erase operation is performed to a whole block of memory cells. Reading information stored in a target memory cell is performed by sensing current flowing through the target memory cell while applying an appropriate voltage to the gate terminal of the target cell.

One of those parasitic effects mentioned above, and the most critical in the recent years, is the floating gate coupling. Since floating gate distance is reduced with evolving technology, the interference due to the programming for neighboring cells becomes higher, thus causing error to the cell's reading or writing.

The parasitic phenomena and the higher and higher scaling capability has recently led to the development of new "charge trap" methods. In particular, according to a first kind of charge trap methods, a SONOS (semiconductor-oxide-nitride-oxide-semiconductor) or MONOS (metal-ONOS) structure is used for each memory cell. Moreover, according to a second type of charge trap methods, the memory array organization is the same as the previous method, in particular, the ones related to the floating gate flash memory. However, some differences exist due to new technology requirements and scaling.

In a conventional NAND memory array, a number of memory cells connected serially with one another form a group which is called a "string". In other words, the drain of a memory cell or floating gate transistor of a string is coupled with the source of another memory cell or floating gate transistor of the same string. This connection is repeated to the other memory cells in the same manner. At each end of a string, a standard transistor is connected to the outmost floating gate transistor, i.e. memory cell, at both ends of the string and these two standard transistors are called drain selection transistor and source selection transistor, respectively. The string selection is performed by enabling or switching on the drain selection transistor and the source selection transistor. Usually, the selection transistors have positive threshold since they are standard transistors, and the selection transistors have reduced process variability.

In charge trap technology, the structure of the selection transistor is the same as that of the other memory cells including charge trap transistor, and this structure allows further array shrink by increasing its uniformity. However, this has a drawback in that the threshold of the selection transistors is affected by the same process dependency of the memory array transistors. Moreover, the threshold of the selection transistors is not a fixed positive value since charge trap transistor is used. The threshold of the selection transistors varies according to the amount of the electrons trapped in the respective gate terminal. Therefore, the threshold of the selection transistors should be properly controlled in this configuration.

To change the threshold voltage of a selection transistor into a different value, the selection transistor needs to be programmed or erased. It is required to program some target selection transistors among a group of selection transistors while preventing the other selection transistors to be influenced by the programming operation of the target selection transistors. Thus, "inhibit" should be considered when designing the method for programming the selection transistors. "Inhibit" means preventing programming operation from interfering with other cells which are not the target of the programming operation.

Conventional methods for programming or inhibiting should be thus enhanced in order to ensure a correct programming of the selection transistors and to avoid spurious programming on inhibited strings.

Therefore, the technical problem of the NAND flash programming methods according to prior art lies in that the threshold voltage of the selection transistors is not controlled precisely since no sophisticated programming operation for the selection transistors is available.

SUMMARY OF THE INVENTION

According to an embodiment, a method includes providing a non-volatile memory device which includes a plurality of cells, a plurality of selection transistors each having a gate and each coupled to associated one of the cells, and a selection line coupled in common to the gates of the selection transistors, applying a first program voltage to the selection line, and applying a second program voltage to the selection line when at least one of the selection transistors have not been shifted to a program condition.

According to another embodiment, a method includes performing an erase operation on a non-volatile memory cell that is coupled to a selection transistor, the performing the erase operation comprising applying a first voltage to the selection transistor, and applying a second voltage to the selection transistor when the selection transistor has not been shifted to an program condition due to the applying the first voltage, the second voltage being larger than the first voltage.

According to still another embodiment, a device includes a non-volatile memory array including a cell and a selection transistor coupled to the cell, and a first circuit supplying first and second program voltages, the first voltage being supplied to the selection transistor in order to shift the selection transistor to a program condition, the second voltage being supplied to the selection transistor when the selection transistor has not been shifted to the program condition due the supplying of the first voltage, the second voltage being larger than the first voltage.

DETAILED DESCRIPTION OF THE EMBODIMENTS

The present disclosure makes reference to a flash memory device, by way of example, a NAND type flash memory. In the following description, it will be assumed that n-type MOSFET transistors, or n-type trap charge transistors are used for the memory cell or selector gate by way of example for the simplicity of explanation, not a purpose of limiting the scope of the invention. P-type MOSFET transistors may be used instead of n-type MOSFET transistors as it would be clear for a technical expert in the field.

Figure 1:
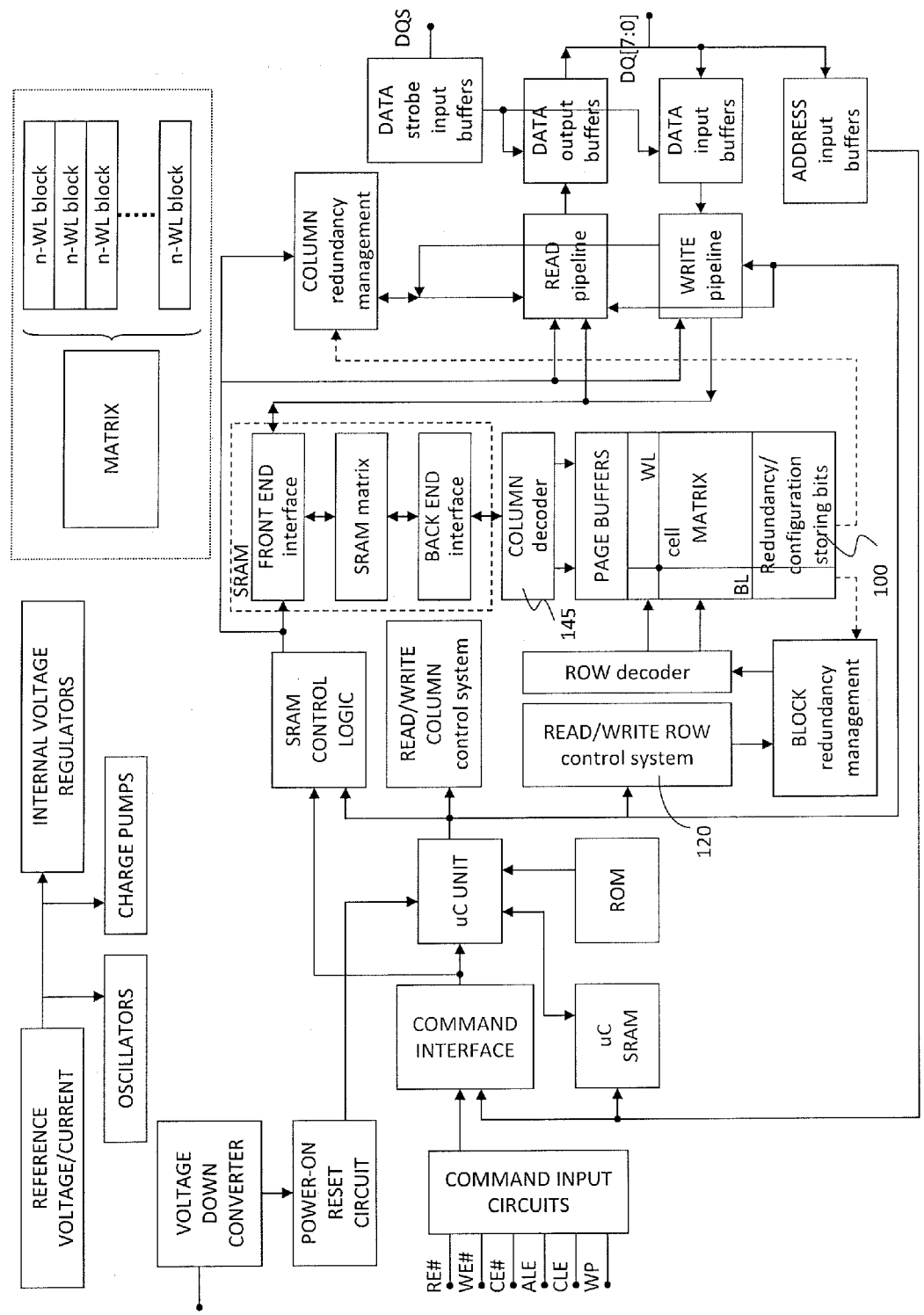
FIG. 1 schematically shows an exemplary structure of a NAND flash memory and a memory controller thereof.

FIG. 1 schematically shows an exemplary structure of a NAND flash memory and a memory controller thereof.

The Flash memory 100, for example, may comprise page buffer, memory cell array, and configuration/redundancy data. Specific address in the Flash memory 100 can be accessed by using a Row Decoder 120 and the Column Decoder 145. The data stored in the Flash memory 100 can be read to a SRAM matrix. Reversely, the data stored in the SRAM matrix can be written into a location of the Flash memory 100.

Figure 2A:
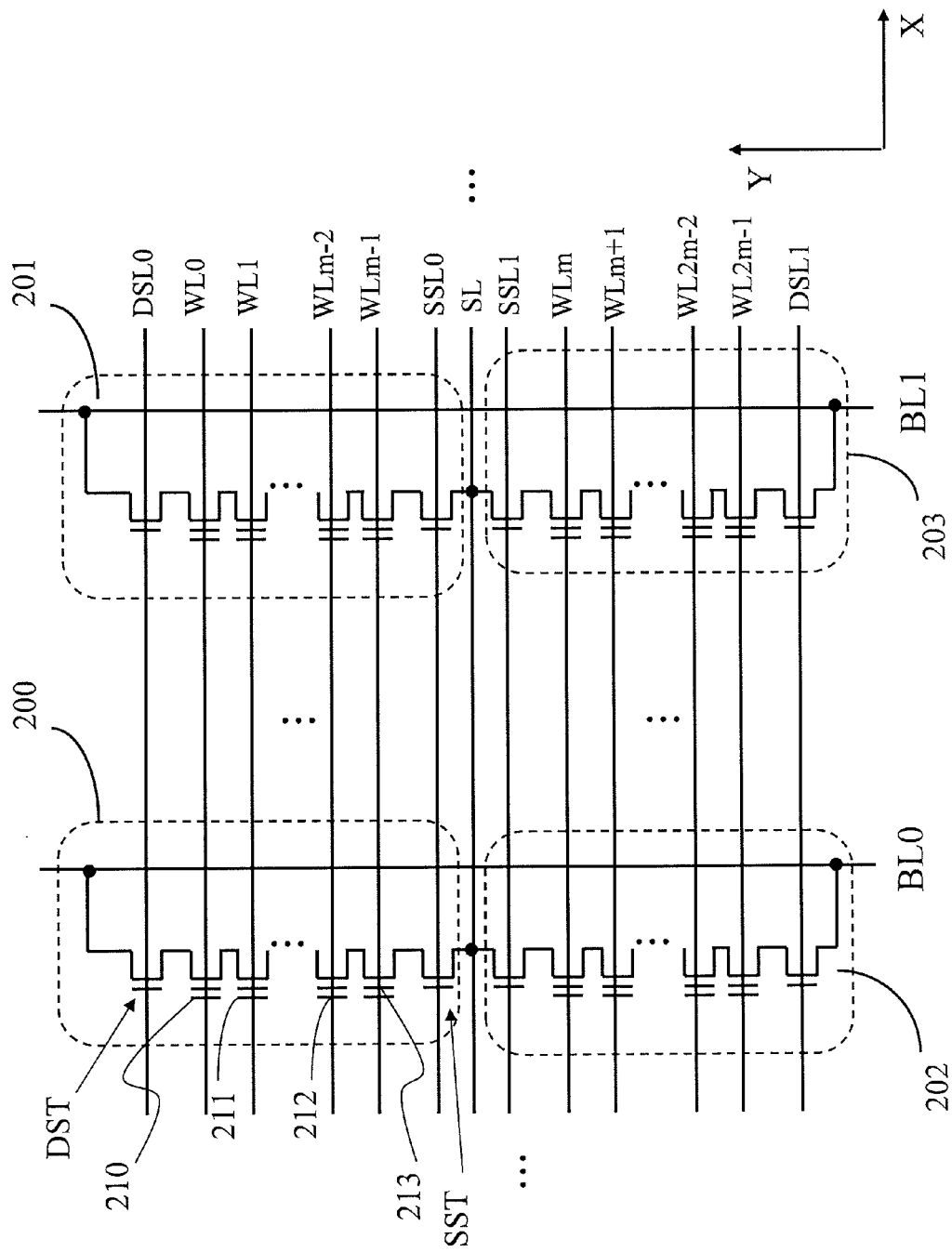
FIGS. 2A and 2B schematically show exemplary structures for strings included in a typical NAND flash memory.
Figure 2B:
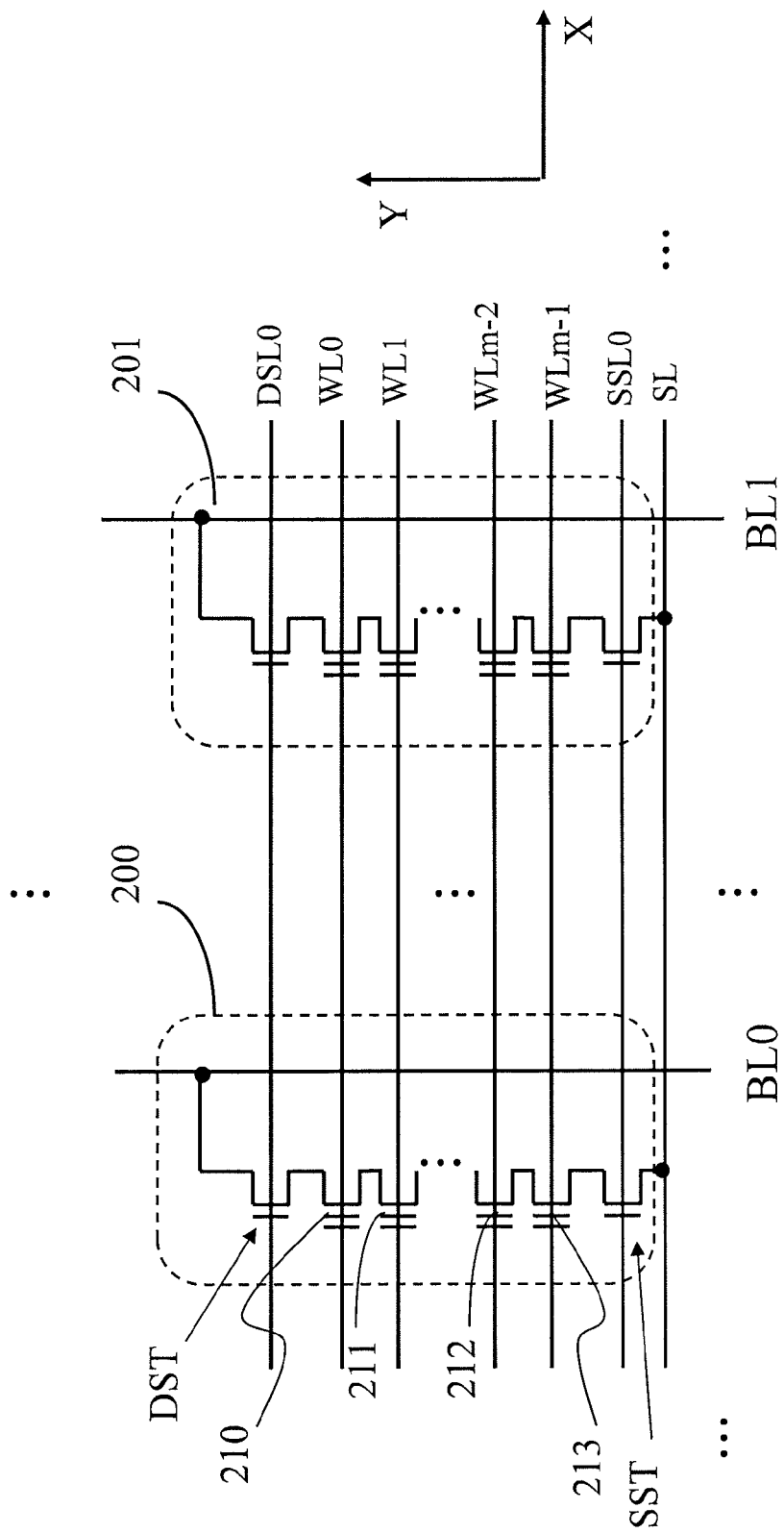

FIGS. 2A and 2B schematically shows exemplary structure for string included in a typical NAND flash memory.

The NAND flash memory 100 shown in FIG. 1 comprises a plurality of strings 200, 201, 202, and 203 shown in FIGS. 2A and 2B. The number of strings depends on the dimension of a page indicated in the specifications of the NAND memory device. The string 200 is composed by a predetermined number of memory cells 210, 211, 212, 213 connected in series. The number of memory cells in one string depends on the process used to manufacture the NAND memory device. In FIG. 2A, the memory cells in the string 200, 202 are connected to a bit-line BL0 through a drain selection transistor DST and to a common source line SL through a source selection transistor SST. The gate terminal of each memory cell is connected to a word line. For example, in FIG. 2A, the gate terminal of memory cell 210 is connected to the word-line WL0, the gate terminal of the memory cell 211 is connected to the word-line WL1, the gate of the memory cell 212 is connected to the word-line $WL_{m-1}$ and the gate terminal of the memory cell 213 is connected to the word-line $WL_m$. The source selection transistor SST is connected to a common source line SL being connected to a ground voltage. In FIG. 2A, one string includes m number of memory cells, and each cell of the string is connected to a word line among m word lines, respectively. Similar structures are repeated horizontally, i.e. X direction, and vertically, i.e. Y direction. In FIG. 2A, a first string 200 and a third string 202 share the same source line SL.

Moreover, a second string 201 and a fourth string 202 are coupled to a bit-line BL1, i.e. an odd bit-line and to the common source line SL, so they also shares the common source line SL and the bit-line BL1.

Each string may be activated by controlling a gate voltage applied to the selection lines DSL0, DSL1, SSL0, and SSL1. By switching on the drain selection transistor DST of the first string 200, the first string 200 may be made electrically connected to the bit-line BL0, and it may supply current to the bit-line BL0 or pull current from the bit-line BL0 depending on the status of the memory cells 210, 211, 212, and 213.

To read a data stored in a specific memory cell, e.g. a memory cell 210, pass voltages are applied to all of the other word lines or unselected word lines in the first string 200 except the word line WL0. Another voltage, which is usually just over the threshold voltage of the voltage of the floating gate terminal, is applied to the word line WL0. If the charge trap layer of the memory cell 210 stores electron inside it, the memory cell 210 does not conduct due to the high threshold voltage of the memory cell 210. On the contrary, if the charge trap layer of the memory cell 210 does not stores electron inside it, the memory cell 210 is switched on and a current flows through the first string 200, such a current being detected by a current sensor circuit connected to the bit line BL0. Then, the memory page buffer may determine that the selected cell 210 stores a bit '1'.

FIG. 2B illustrates the two strings 200 and 201 which are located at the upper portion of the FIG. 2A.

Figure 2C:
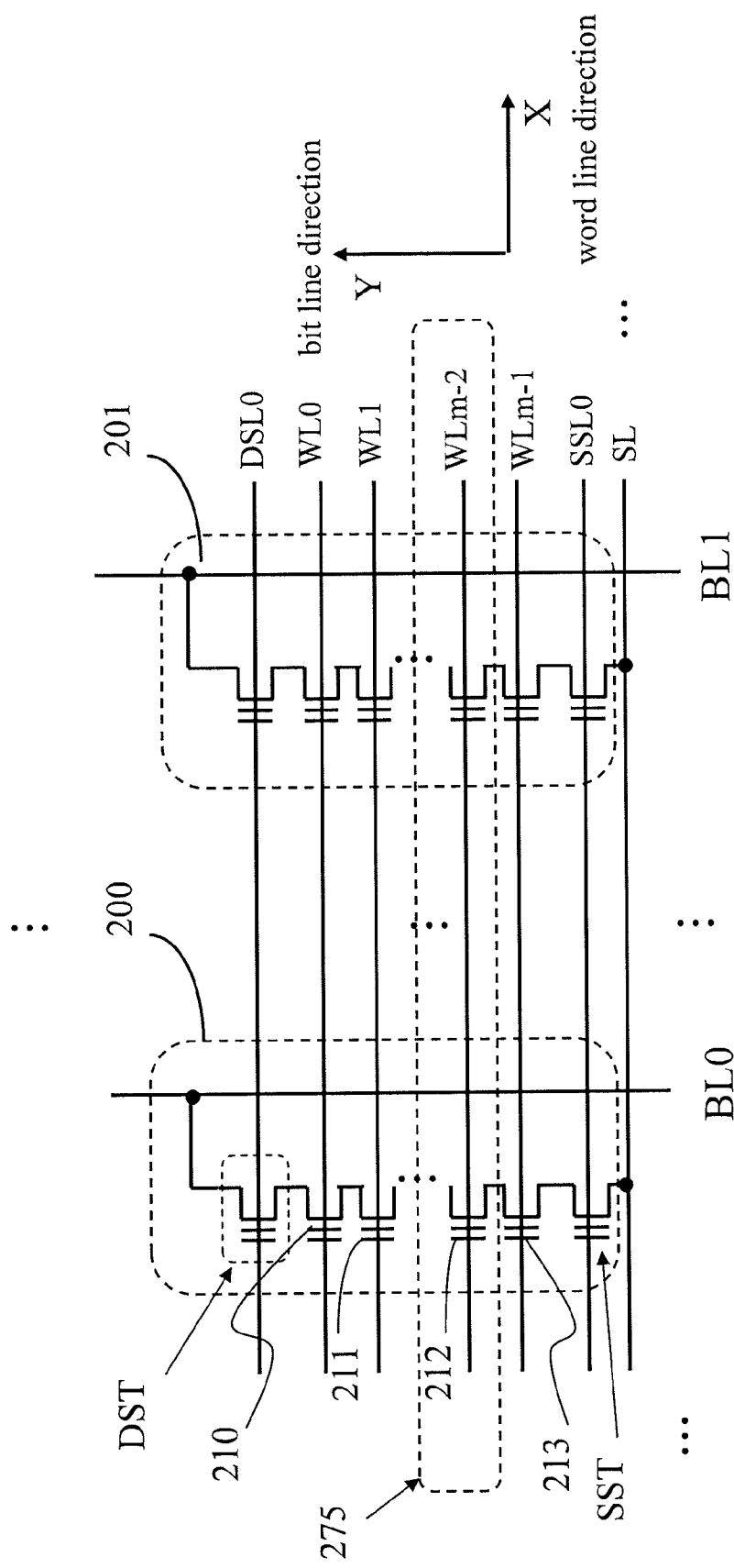
FIG. 2C schematically shows an exemplary structure of strings included in a NAND flash memory according to the invention.

FIG. 2C schematically shows exemplary structure for string included in a NAND flash memory according to the invention.

Comparing the cell structure of FIG. 2C with the cell structure of FIG. 2B, it is noted that the drains selection transistor DST and the source selection transistor SST have the same structure as the other memory cells in the string, e.g. a floating gate transistor as shown in FIG. 2C. On the other hand, it is noted that the drains selection transistor DST and the source selection transistor SST do not have the same structure as the other memory cells in the string as shown in FIG. 2B. Herein after, the floating gate transistor or the charge trap transistor will be used interchangeably since the invention covers both type of NAND flash memories.

Programming operation is usually performed on a page of the memory array. All the cells of the memory array belonging to the same page may share the same gate connection to the same word line. In FIG. 2C, the cells in the box 275 may belong to the same page. Depending on the device architecture, one page may comprise cells whose gate terminals are connected to the same word line. In an alternative architecture, one page may comprise cells sharing a same word line and being connected to even bit lines among the bit lines, and memory cells connected to odd bit lines constitute the odd bit lines. In this case, one page of even and odd pages is selected for performing program operation on it and the other page is put in an inhibit state. In both architectures, cells under programming may be biased with high voltage on their gate terminal and with a ground voltage applied to their channel. By programming operation, electrons are trapped in the floating gate, or in the nitride layer of the charge trap gate, in case a charge trap NAND flash is used, according to the Fowler-Nordheim effect. This programming operation may be performed by turning off the drain selection transistor DST and coupling the bit line to a ground voltage.

The memory cells in an inhibit state on the same word-line are not to be programmed. For this purpose, the memory cells in an inhibit state on the same word-line would have a low voltage difference between their gate terminal and channel. Otherwise, these cells would be programmed.

"Self boosting" technique may be used for preventing cells in an inhibit state from being programmed. According to the self-boosting technique, a pass voltage is applied first to all word lines in the same string and a program voltage is applied then to a selected word line, and, due to the channel coupling between the word lines, the voltage of the floating channels connected to the unselected bit lines is lifted up approximately to the voltage of the unselected word line, i.e. in case the selectors are in off state and then the channels are floating, are boosted up to a voltage between a program gate voltage and ground. This depends on the capacitive coupling factor αG; for instance, αG=0.6 the channels boosting voltage will be 0.6*program gate voltage.

The self-boosting technique cannot be applied to the described selection transistors DST because it requires the selection transistors DST to be floated and this is not feasible because these transistors are in the ON state and their channels are then biased to a same voltage of the bit lines and thus cannot be boosted.

In FIG. 2C, the drain selection transistor DST and the source selection transistor SST may be realized by floating gate transistor or trap charge transistor. Since the selection transistors are not standard transistors with a fixed threshold voltage $V_{th}$, the threshold voltage $V_{th}$ of the selection transistors DST or SST should be precisely controlled. Otherwise, the selection transistors would leak current with its minus threshold voltage value. The threshold voltage $V_{th}$ of the selection transistors DST or SST may be controlled by a programming operation.

Figure 3A:
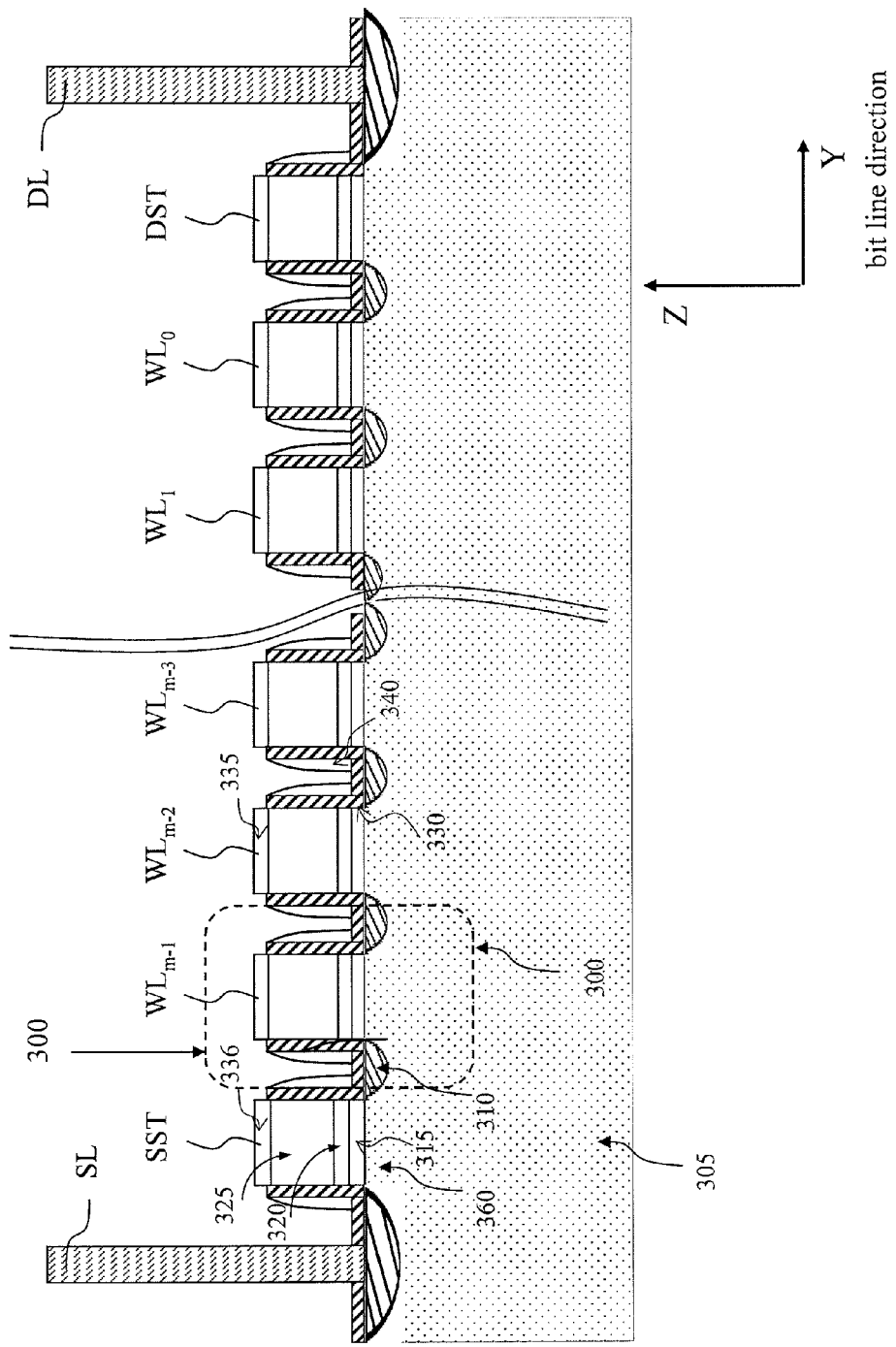
FIG. 3A schematically shows a cross sectional view of an exemplary NAND flash memory cells along bit line direction.
Figure 3B:
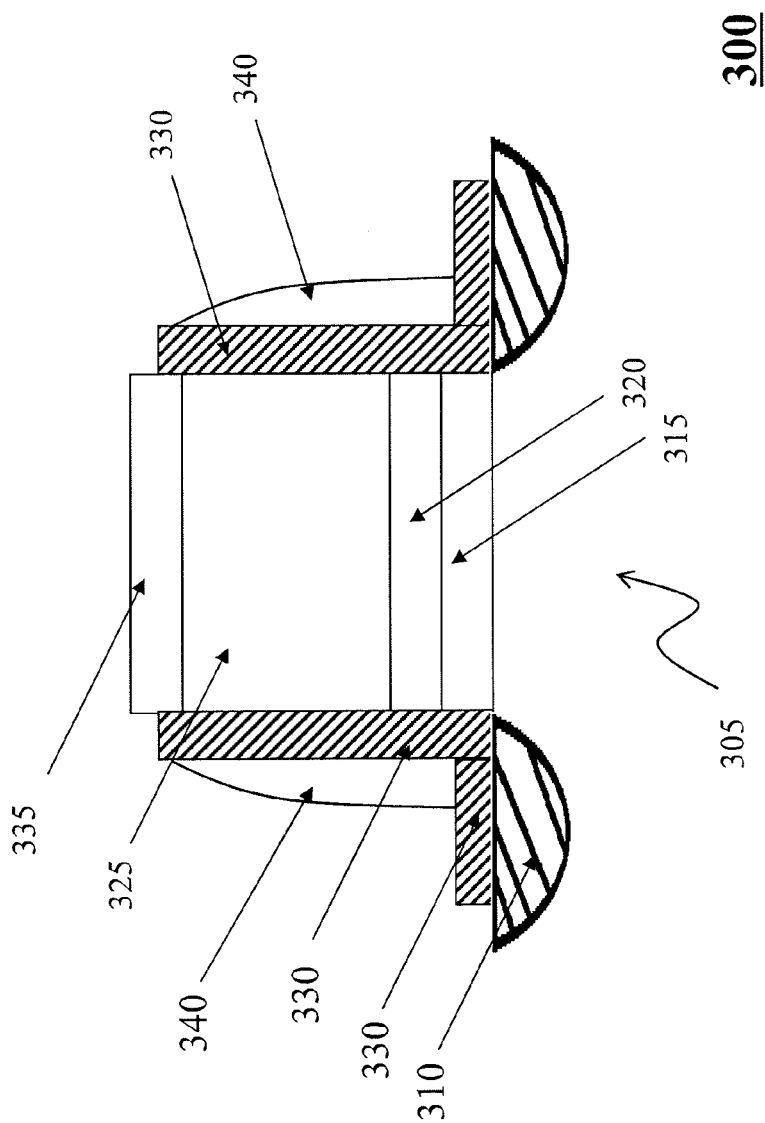
FIG. 3B schematically shows a memory cell of NAND flash memory of FIG. 3A.

FIG. 3A schematically shows a cross sectional view of an exemplary NAND flash memory cells along a bit line direction. FIG. 3B schematically shows a memory cell of the NAND flash memory of FIG. 3A. The memory cell 300 is substantially the same in a structure as the selection transistor and thus the selection transistor includes such structure as shown in FIG. 3b. FIG. 3B magnifies and illustrates a memory cell 300 shown in FIG. 3A. Hereinafter, the layer structure of the memory cells of a NAND flash memory will be explained in reference to FIGS. 3A and 3B.

In FIG. 3A, a plurality of memory cells 300 are arranged along a bit line direction or Y direction. On top of each memory cell 300, there is a word line layer 335 connected to the plurality of layers disposed beneath. The word line layer 335 and the selection line 336 extend perpendicularly to the view surface of FIG. 3A.

Each memory cell 300 may comprise word line layer 335 made of conducting material, silicon oxide film 325, charge trapping region 320 made of silicon nitride film, and tunneling silicon oxide film 315. The charge trapping region 320 may include the silicon nitride film that comprise a plurality of layers (regions or portions), one of which is a Silicon Rich Nitride (SiN) that is richer in Silicon ratio than the other layers. Beside each memory cell 300 or each selector gate 360, there is a side wall or spacer 340 made of oxide. Between the spacer 340 and the memory cell 300, an isolation layer 330 is interposed. The well 305, e.g. P type well, is disposed below the memory cell 300. N-doped regions 310 are disposed at both sides of the charge trapping region 320 and beneath the isolation layer 330. The selection transistor 360 comprises a selection line layer 336 instead of a word line layer 335. Electrons are trapped into the charge trapping region 320 by the programming operation. If electrons are trapped in the charge trapping region 320, the corresponding memory cell stores a '0' bit information. If the trapped electrons are removed from the charge trapping region 320 by an erase operation, the corresponding memory cell stores a '1' bit information. When a channel of electron is formed in the P type well 305 between the N-doped regions 310 by a control voltage applied to the word line layer 335, a current may flow through the channel itself. The threshold voltage for activating the channel is dependent on the electrons trapped in the charge trapping regions 320. The silicon oxide film 325 is thicker than the tunneling silicon oxide film 315 so that electrons are flowing through the tunneling silicon oxide film 315 instead of the silicon oxide film 325.

Figure 4A:
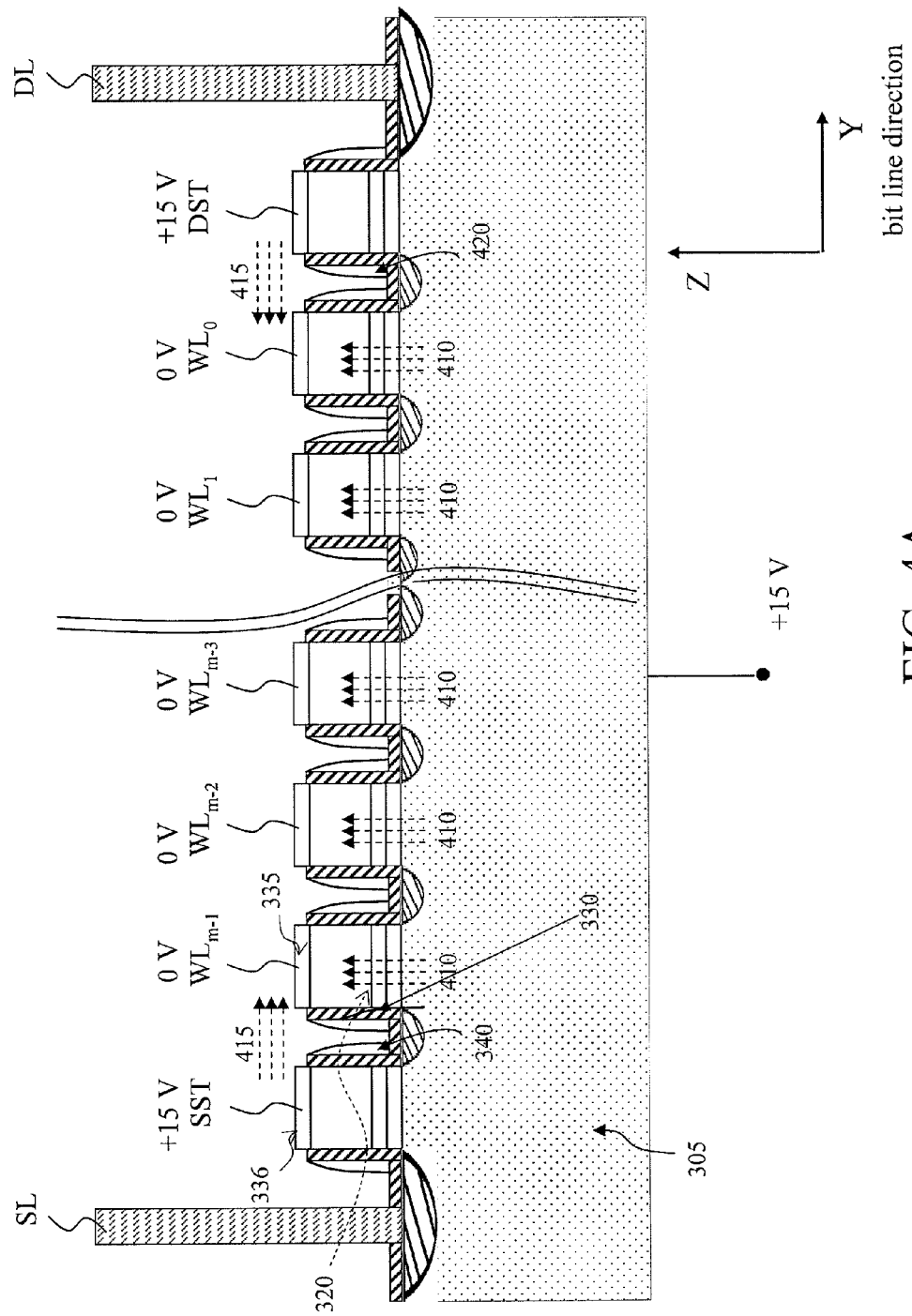
FIG. 4A schematically shows the cross section of the NAND flash memory of FIG. 3A when an erase operation is performed and the voltage of the drain selection line is the same as that of the well.

FIG. 4A schematically shows the cross section of the NAND flash memory, especially in order to explain for an undesirable situation occurs when an erase operation is performed on the memory cells and the voltage of the drain selection line is the same as the voltage of the well.

In a NAND flash memory, the erase operation is performed on block basis. During the erase operation, the P type well 305 is biased to a high voltage, e.g. +15V. The word line layer 335 is biased to the ground voltage, i.e. 0 V. This voltage difference generates an electric force 410 bypassing each memory cell, the direction of which is upward in FIG. 4A. In FIG. 4A, since the source selection transistor SST and the drain selection transistor DST have the same structure as the other memory cells, it is optimal to apply the same voltage of the P type well 305, e.g. +15 V, also to the selection line layer 306 so that the threshold voltage of the source selection transistor SST and the drain selection transistor DST may not vary because no electric force is passing through each of the memory cells. If the voltage difference between the P type well 305 and the selection line layer 336 is not 0 V, then an electric force 435 will be induced through the source selection transistor SST and the drain selection transistor DST as depicted in FIG. 4B.

As shown in FIG. 4A, if a high voltage, e.g. +15 V, is applied to the selection line, a strong lateral electronic force 415 is generated between the selection line layer 336 and the nearest word line layer 335. The direction of the lateral electronic force 415 is set from the selection line layer 336 to the word line layer 335. Since this lateral electric force is strong, the electron trapped in the charge trapping region 320 can tunnel through the isolation layer 330 of the memory cell's edge, and trapped in the spacer 340 and/or in the isolation layer 330 permanently. This wrongfully trapped electrons will affect the threshold voltage of the selection transistor and of the nearest memory cell, and makes it difficult to control the threshold voltage of the memory cell itself.

Thus, this lateral movement of electrons during an erase operation as explained above in FIG. 4A should be avoided. In order to avoid this undesirable effect, it can be considered to lower the voltage applied to the selection line layer 336 as shown in FIG. 4B. As will be explained below, this undesirable situation of FIG. 4A is avoided and/or solved in FIG. 4B.

Figure 4B:
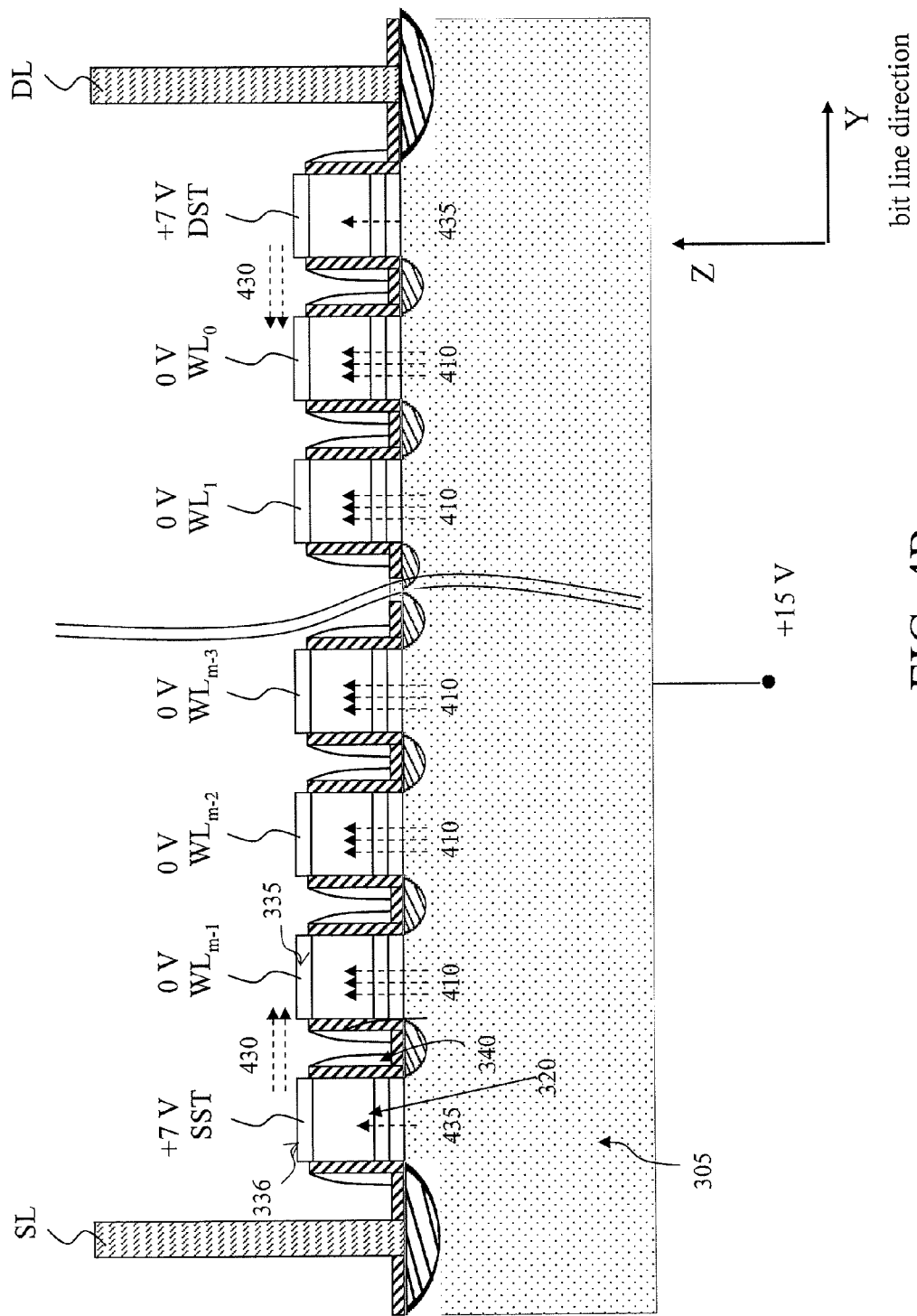
FIG. 4B schematically shows the cross section of the NAND flash memory of FIG. 3A when an erase operation is performed and the voltage of the drain selection line is lower than that of the well.

FIG. 4B schematically shows the cross section of the NAND flash memory, especially in order to explain for the solution of the undesirable situation of FIG. 4A and further explain for another undesirable situation of FIG. 4B occurs when the erase operation is performed on the memory cells and the voltage of the drain selection line is lower than the voltage of the well.

In FIG. 4B, a lower selector voltage, e.g. +7 V, is applied to the selection line layer 336. The lower selector voltage also reduces the electric force 430 between the selection line layer 336 and the word line layer 335, thus preventing unexpected electron from being trapped in the spacer 340 and/or in the isolation layer 330.

However, applying non-ground voltage on the selection line layer 336 generates a vertical electric force 435 passing through the source selection transistor SST and the drain selection transistor DST. This electric force 435 of the selection transistors is weaker than the electric force 410 passing through the memory cells. However, the electric force 435 of the selection transistors also partially erases the selection transistors during the erase operation, thus modifying the threshold voltage of the source selection transistor SST and the drain selection transistor DST. In worst case, if electrons are completely removed from the charge trapping region 320 of the selector transistors SST and DST, the threshold voltage could have a negative value. If the threshold voltage is negative, the selector transistor is switched on even if there is no voltage applied on its selection line layer, which generates a current leakage.

Therefore, the undesirable situation explained above in FIG. 4B needs to be further avoided and/or solved. In this view, the threshold voltage of the source selection transistor SST and the drain selection transistor DST should be recovered to a precise value by using a programming operation for the source selection transistor SST and the drain selection transistor DST. As will be explained below, the operations shown in FIGS. 5A and 5B can solve the undesirable situation of FIG. 4B.

Figure 5A:
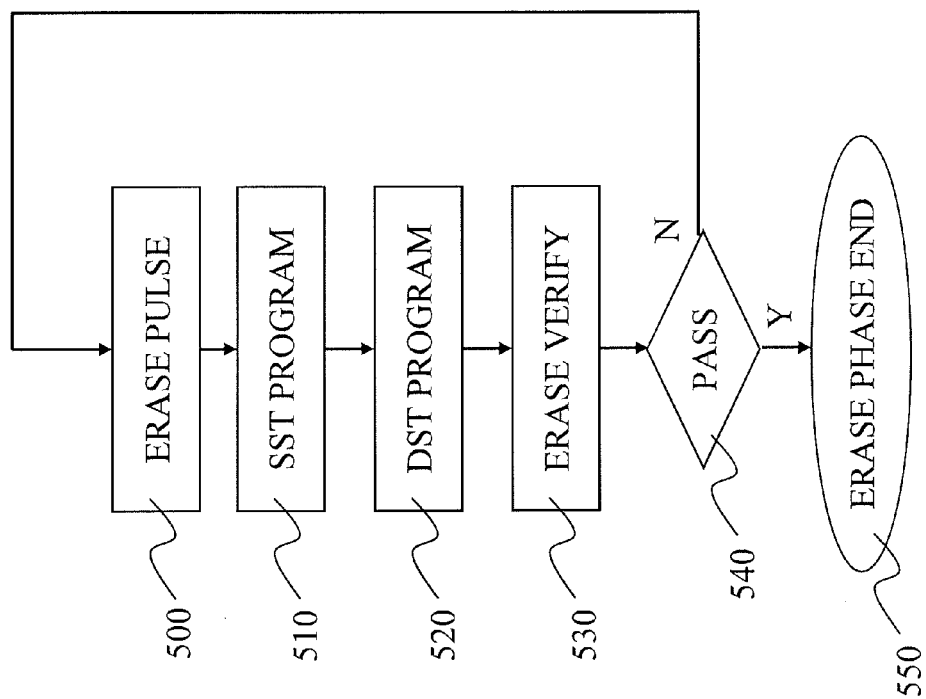
FIG. 5A shows a flow chart relating to the steps performing the recovery of a threshold value of selection transistors.

FIG. 5A shows a flow chart relating to the step required for the recovery of the threshold value of the selection transistors.

When an erase operation is required for a certain block of memory cells, then it starts by applying an erase pulse for the block (step 500) such as shown in FIGS. 4A and 4B. As explained above, to avoid strong lateral electric force derived by the voltage difference between the selection line and the word line, the voltage applied to the selection line should be lowered to a certain value such as 7 V shown in FIG. 4B, and the erase voltage configuration as shown in FIG. 4B should be preferably chosen as the step 500, so that the later electric force may not trap electrons between the cells in the spacer 340 and/or in the isolation layer 330. This lowered voltage value ad applied to the selection line causes the source selection transistor SST and the drain selection transistor DST to be partially erased as explained in FIG. 4B, so that the threshold voltage of the source selection transistor SST and the drain selection transistor DST may be consequently modified. According to the disclosure, to recover the threshold voltage of the selection transistors SST and DST, the source selection transistor SST and the drain selection transistor DST is thus programmed, and thus the steps 510, 520 are performed after the step 500 has been performed.

In line with the above explanation, the source selection transistor SST is programmed (step 510). Then, the drain selection transistor DST is programmed (step 520). The selection transistors SST and DST involved in the programming steps belong to the block on which the erase pulse operation of the step 500 has been performed. The sequence of programming also can be changed, i.e, the selection transistor DST is firstly programmed and then the programming of the selection transistor SST follows. Thus, the step 520 may be performed before the step 501.

Then, the erase verify operation is performed (step 530). In the verification step, the logical values of all the memory cells in the block are checked, and if none of the memory cells have the value of '0', then, the erase operation is finished ('Y' in step 540, and then step 550). However, if any of the memory cells in the block is not completely erased, then the erase operation proceeds as 'N' in step 540, and steps 500, 510, 520 and 530 are repeated at least one more time ('N' in step 540) until the step 540 goes to the 'Y' and the erase phase ends at the step 550.

Figure 5B:
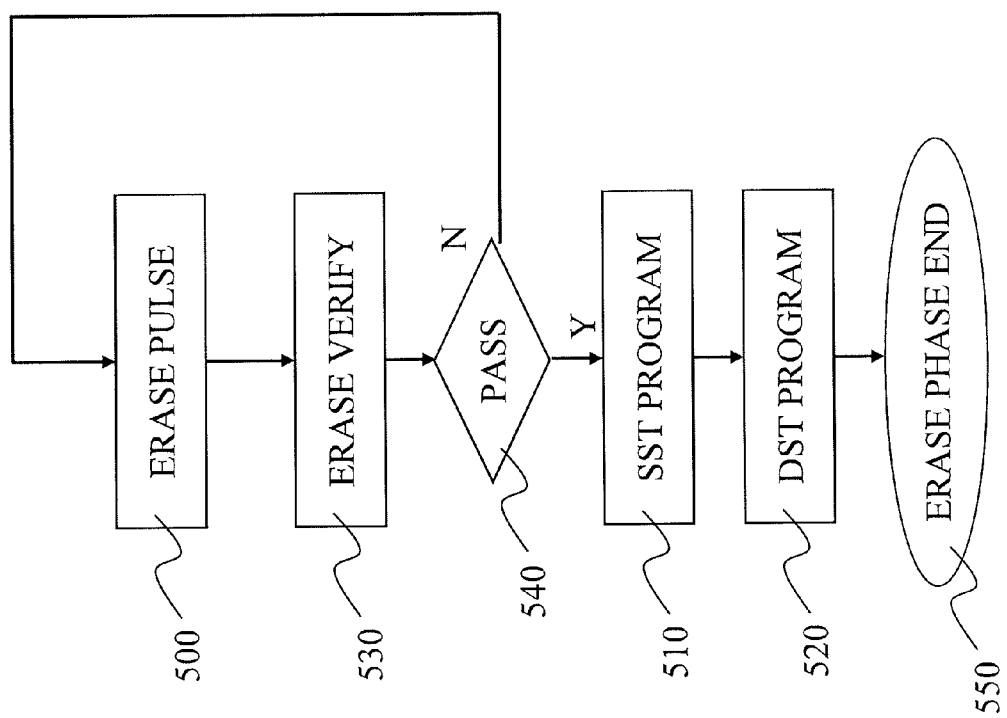
FIG. 5B shows another flow chart relating to the steps performing the recovery of a threshold value of selection transistors.

FIG. 5B shows another flow chart relating to the step required for the recovery of the threshold value of the selection transistors. In FIG. 5B, the steps 510 and 520 shown in FIG. 5A could be placed outside the loop, in particular after a positive result (Y) of step 540.

The need for controlling the threshold voltage has been explained in connection with the erase operation, but the invention is not limited thereto. The threshold voltage control may be required in other phase of the NAND flash memory operation. Whenever the threshold voltage adjustment for the selection transistors is required, the method of the invention can be used.

Figure 6:
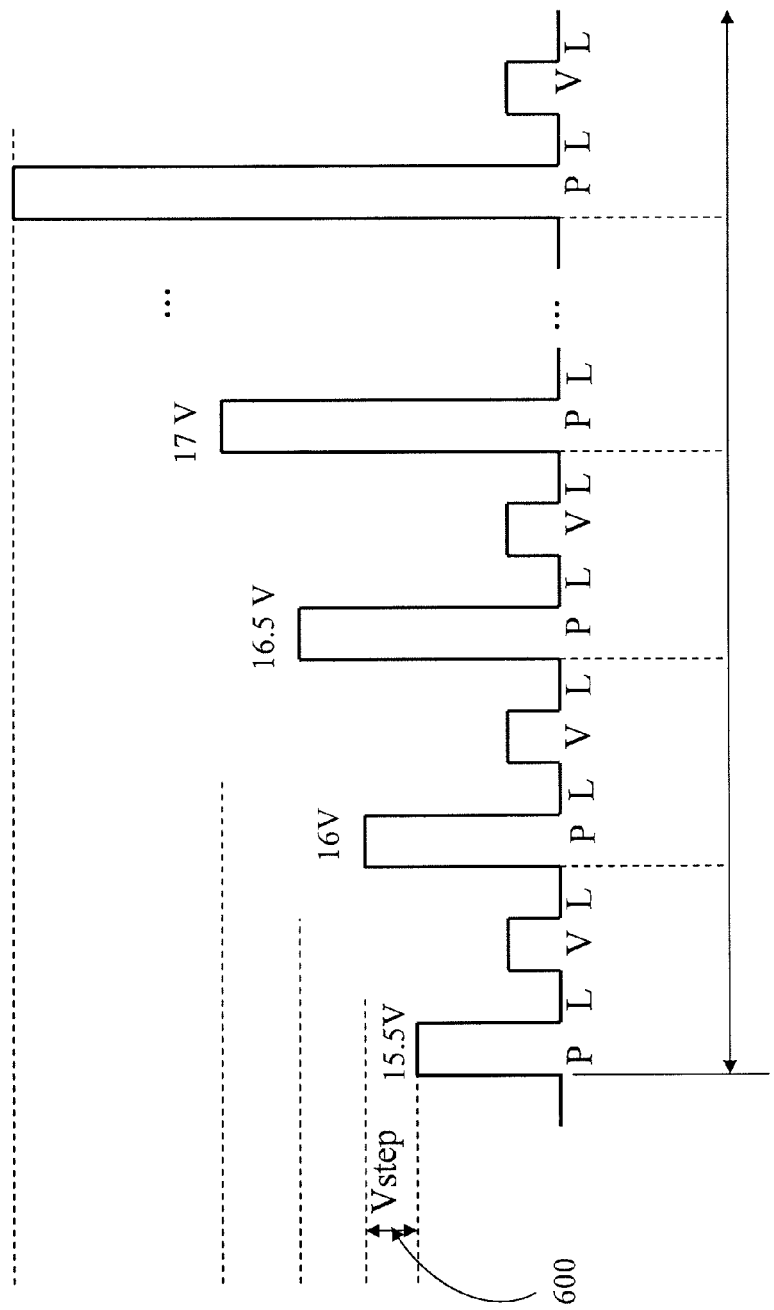
FIG. 6 schematically shows the pulse applied to the selection line for selection transistors.

FIG. 6 schematically shows the pulses that are applied to the selection line for the selection transistors.

The programming of the selection transistors can be achieved by applying a program pulse on their gate terminals with the P type well 305 grounded and all other word lines biased to a pass voltage. The pulses of FIG. 6 are applied to the selection transistor in each of the steps 510 and 520 of FIG. 5. The pulses of FIG. 6 are called ISPP (Incremental step pulse programming). ISPP (Incremental step pulse programming) technique is thus used for programming the selection transistor.

In FIG. 6, an initial programming voltage for example 15.5 V is applied to the selection transistor during a certain time P. During the period P, the selection transistor is programmed. Then, a low voltage, e.g. ground voltage, is applied to the gate terminal of the selection transistor for a certain period L.

Afterward, a verification voltage is applied to the gate terminal of the selection transistor during a verification period V to check whether the gate terminal is at a desired threshold voltage (i.e. whether the selection transistor has been shifted successfully to a program condition or not). When the verification voltage is applied to the gate terminals of the memory cells, if the selection transistor is still switched ON, the selection transistor does not have the desired threshold voltage (i.e. it is verified that the selection transistor has not been successfully shifted to the program condition). Then, the second programming voltage for example 16 V, which is higher than the initial voltage e.g. 15.5 V, is applied to the gate terminal of the selection transistor.

On the contrary, if the selection transistor is switched OFF when the verification voltage is applied on, then the selection transistor has the desired threshold voltage (i.e. it is verified that the selection transistor has been successfully shifted to the program condition), and the verification process is terminated. The verification voltage is not necessarily equal to the target threshold voltage. Offset between the verification voltage and the target threshold voltage can be considered.

During the period of the verification phase, the pass voltages should be applied respectively to the gate terminals of memory cells and the other selection transistor in the same string (i.e. that is, the selection transistor SST in case that the selection transistor DST is to be programmed. Also that is the selection transistor DST in case that the selection transistor SST is to be programmed). Thus those memory cells and the other selection transistor in the same string is switched on (is rendered conductive), so that the current flows through the string in case the target selection transistor is not successfully programmed, on the other hand the current does not flow through the string in case the target selection transistor is successfully programmed. By sensing the flow, it is determined whether the program pulse application has successfully shifted the selection transistor to the program condition. As will be explained below, such a sensing circuit as denoted by 820 in FIG. 8A can sense such the current, and based on the sensing, such a controller as denoted by 810 in FIG. 8A can recognize whether the target selection transistor has been successfully shifted to the program condition.

The ISPP pulses application of FIG. 6 proceeds until it is verified that the target selection transistor is successfully programmed so as to have the target threshold voltage. When it is verified so, the application is terminated. The ISPP pulses application may be terminated by the controller in response to counting the number of the pulses or measuring the total time to be used in the whole ISPP operation.

Figure 7:
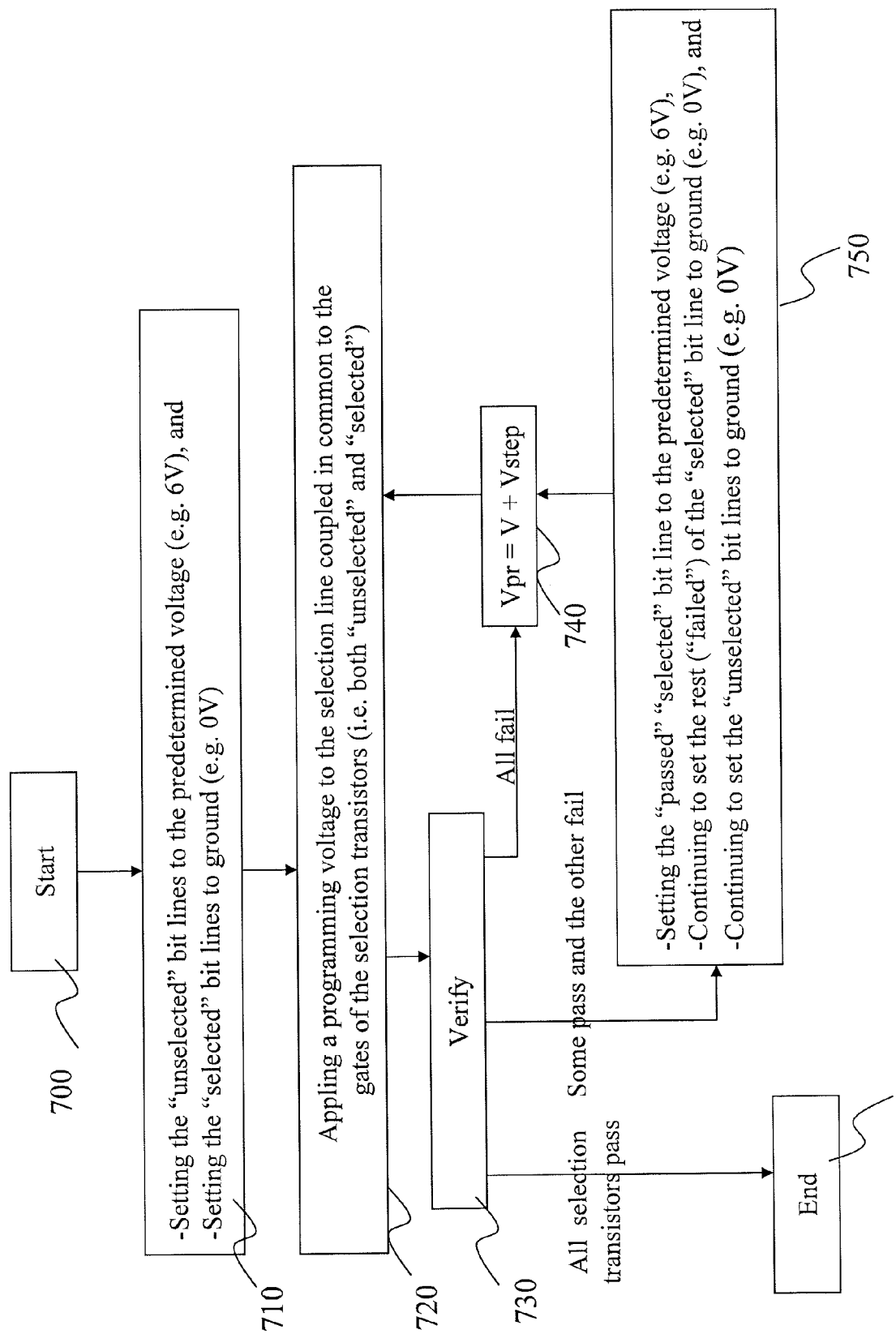
FIG. 7 schematically shows a flow chart relating to the method for programming selection transistors according to an embodiment of the invention.

FIG. 7 shows a flow chart relating to the method for programming the drain selection transistors according to an embodiment of the invention. The program operation for the drain selection transistors may be performed as a part of an erase operation. However, the scope of the invention is not limited thereto, thus whenever the recovery of the threshold voltage of the selection transistor is needed, the method of the invention may be used. The method can be performed by applying a specific control signal to control a block or circuit of the NAND flash memory.

At the step 700 when the operation of FIG. 7 starts, drain selection transistors to be programmed should be selected. Each of the drain selection transistors to be programmed may share in common the same drain selection line. Then, based on address information supplied to the flash memory, the unselected bit lines (or BL) and selected bit lines are determined. The "selected" bit line is such bit line as being coupled to the cell which is to be programmed. The "unselected" bit line is such the bit line as being coupled to the cell which is not to be programmed. The "selected" selection transistor is such selection transistor as being coupled to the "selected" bit line. The "unselected" selection transistor is such selection transistor as being coupled to the "selected" bit line.

In the operation of FIG. 7, some drain selection transistors connected to the common drain selection line needs to be programmed while the other drain selection transistors connected to the common drain selection line do not need to be programmed. For example, the programming operation can be planned so that only the drain selection transistors which are connected to the even bit lines are to be programmed and only the drain selection transistors which are connected to the odd bit lines are not be programmed. Referring to FIG. 2A, the drain selection transistor DST connected to BL0 is supposed to be programmed because BL0 is an even bit line and the drain selection transistor DST connected to BL1 is not supposed to be programmed because BL1 is an odd bit line. This requirement is needed in some architecture of NAND flash memory where even and odd bit-lines are selected alternatively and belong to different pages so that they may be read and programmed independently.

The exemplary situation will be explained below in the assumption that the drain selection transistors of the even bit lines are 'selected' bit lines, and the drain selection transistors of the odd bit lines are 'unselected' bit lines.

At the step 710, the unselected bit lines are set to a predetermined voltage, e.g. 6V, and the selected bit lines to a ground voltage, e.g. 0V. The predetermined voltage may be determined so that it meets the requirements for the inhibit condition of the unselected bit lines. This is because the drain selection line is shared commonly by 'unselected' and 'selected' drain selection transistors, and such the drain selection line receive a selection voltage from a voltage supplying circuit. The selection voltage is supplied commonly to the gates of the "selected" and "unselected" drain selection transistors. For this, the drain voltage of the unselected selection transistors needs to be adjusted to a value for example 6 volt in order to avoid the program for the unselected selection transistors. By making the voltage difference between the gate and channel of the "unselected" drain selection transistor lower than a certain value, the program is avoided. On the other hand, the drain voltage of the "selected" selection transistors needs to be adjusted to another value for example 0 volt in order to allow the program for the selected selection transistors. By the voltage difference between the gate and channel of the "selected" drain selection transistor higher than the certain value, the program is allowed. The certain value may be a value of the threshold voltage of the selection transistor.

At the step 720, the programming voltage is applied to the selection line coupled to the gate terminals of the drain selection transistors. In an example, the ISPP pulse of FIG. 6 can be used as the steps 720, 730 and 740 shown in FIG. 7. In case the ISPP technology is used for programming the drain selection transistor.

At the step 730, it is verified whether the drain selection transistors have been completely shifted to the program condition or not. The drain selection transistor which has passed the verification (i.e. "passed") is considered as being programmed (the selection transistor has been successfully shifted to the program condition), on the other hand, the drain selection transistor which has not passed the verification (i.e. "failed") is considered as being not programmed (the selection transistor has not been successfully shifted to the program condition).

When all of the selection transistors have passed, the operation shown in FIG. 7 ends (step 760).

On the other hand, when at least one of the selection transistors has been failed, the operation of FIG. 7 proceeds (step 740/750). When some selection transistors have passed but the other selection transistors have not passed, the step 750 follows. When all of the selection transistors have failed, the step 740 follows.

At the step 750, the passed selected bit line is set to the predetermined voltage (e.g. 6V). In other words, a voltage applied to the selected bit line that is coupled to the "passed" drain selection transistor changes from 0 V to 6V. Thus, those "passed" drain selection transistors are set to be in the inhibit condition during the following programming. At the step 750, the failed selected bit line is continued to be set to the ground (e.g. 0V). In other words, the voltage applied to the selected bit line that is coupled to the "failed" drain selection transistors does not change. Thus, those "failed" drain selection transistors is not set to be in the inhibit condition. At the step 750, the unselected bit lines are continued to be set to the ground (e.g. 0V). It is noted that as explained above, the unselected bit lines has been already set to the ground voltage at the step 710. After step 750, the step 740 follows.

At the step 740, the programming voltage is increased by a certain value, for example 0.5 V as shown in FIG. 6. In another example of this step, the programming voltage may keep substantially the same voltage as the previous one. Depending on actual manufacturing product, that may be chosen.

Then, the steps 720, 730 follow. The operation of FIG. 7 proceeds until it ends at step 760.

Referring back to FIG. 6, the following steps are performed. First of all, a programming voltage is applied to the drain selection line during a first period of time. For example, a programming voltage 15.5 V is applied to the drain selection line during the period P of FIG. 6. Then, a ground voltage or a voltage close to the ground voltage is applied to the drain selection line during second period, e.g. the period L of FIG. 6. After that, a verification voltage is applied to the drain selection line during the third period of time, e.g. the period V of FIG. 6. Then, a ground voltage or a voltage close to the ground voltage is applied to the drain selection line again during the fourth period of time, e.g. the period L. When the verification voltage is applied to the drain selection line, if the verification voltage is higher than a value associated with the threshold voltage of a drain selection transistor among the 'selected' and 'unselected' drain selection transistors, the drain selection transistor is considered as not being programmed. On the contrary, if the verification voltage is lower than a value associated with the threshold voltage of a drain selection transistor among the 'selected' and 'unselected' drain selection transistors, the drain selection transistor is considered as being programmed. More particularly, the verification can be performed by detecting the flow of current through a bit line associated with the drain selection transistor. This detection can be done by applying a pass voltage to all word lines belong to the same string of the drain selection transistor while the above verification method is performed for the drain selection line. In this case, if the verification voltage is high enough to turn on the drain selection transistor, the current flows through the corresponding string to the corresponding bit line, on which the page buffer or current sensing circuit can detect a current flowing. On the contrary, if the verification voltage is not high enough to turn on the drain selection transistor, the current does not flow through the corresponding string to the corresponding bit line, on which the page buffer or current sensing circuit cannot detect a current flowing. If a current being higher than a certain value is detected in a 'selected' bit line, the 'selected' bit line passes the verification. Otherwise, if no current or a current lower that the certain value is detected in a 'selected' bit line, the 'selected' bit line does pass the verification. In another example, instead of an ISPP pulse, only two level of voltages are used for programming and verification of the drain selection transistor. That is to say, a programming voltage is applied to the drain selection line for the first period of time, then without applying ground voltage, a verification voltage is applied to the drain selection line continuously. The verify step 730 and the programming voltage apply step 720 have been explained in detail at this point. Then, if all or part of the selected bit-lines failed to pass the verification, the programming voltage is increased by a certain value and the step of programming 720 is repeated (step 740). Assuming that Vpr is a programming voltage, the new programming voltage becomes Vpr+Vstep as indicate in FIG. 7. For example, referring to FIG. 6, Vstep, also indicated by 600, is 0.5 V and the value of the second programming voltage is 16 V, which is 0.5 V higher than the first programming voltage 15.5 V.

Regarding the setting of the "inhibit" in the operation shown in FIG. 7, if any one of the selected drain selection transistors have succeeded to pass the verification step, the state moves to the step 750 in FIG. 7. Because the drain selection transistors which pass the verification are considered as being programmed, those drain selection transistors should be kept in the inhibit condition during the programming of other selected bit lines. Otherwise, the drain selection transistors which have been already programmed are provided programming voltage to their gate again relentlessly, which causes an erroneous threshold voltage to be provided for those drain selection transistors. To put a drain selection transistor already programmed in the inhibit condition, the voltage gap between the gate and the drain terminals or between the gate terminal and the channel of the drain selection transistor should be minimized. For this purpose, the selected bit lines which already passed the verification are set to a predetermined voltage, e.g. 6V, which is equivalent to the voltage applied to the 'unselected' bit lines. In this way, not only the 'unselected' bit lines but also the bit lines of the duly programmed drain selection transistor remain in the inhibit condition. Then, for the bit lines whose drain selection transistors are not programmed yet, i.e. have failed the verification, the ground voltage, e.g. 0V, is applied continuously. With this voltage setup, the step 710 is repeated. Due to this configuration, additional programming operation applied to the already programmed selection transistors can be avoided, thereby improving the precision of the threshold voltage of the selection transistors.

As a result of the operation of FIG. 7, the threshold voltage of the selection transistors is controlled precisely, which improves the performance of NAND flash memory device.

Figure 8A:
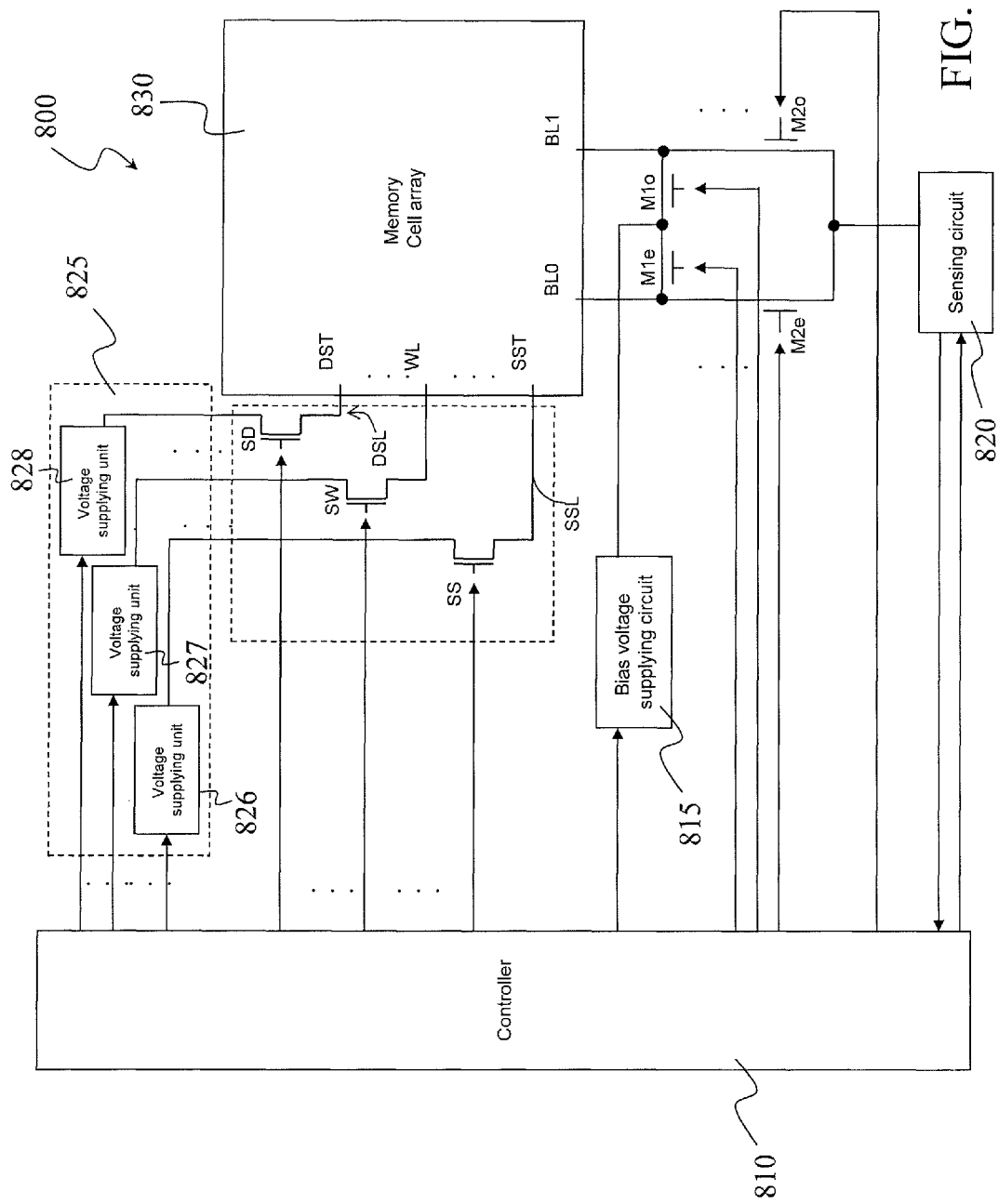
FIG. 8A schematically shows the structure of a NAND flash memory according to another embodiment of the invention.

FIG. 8A schematically shows the structure of a NAND flash memory device according to the invention. The memory device will be explained in reference to FIG. 8A in connection with the already described FIG. 2A.

The NAND flash memory 800 of FIG. 8A comprises a controller 810, a memory cell array 830 including a plurality of strings. Each string includes a predetermined number of memory cells as shown in FIG. 2A. The NAND flash memory comprises a plurality of drain selection transistors DST switching the connection between a plurality of memory cells belonging to the same string 200 and a corresponding drain selection line DSL. The drain selection transistors DST are configured to trap electrons in their gates. The NAND flash memory comprises a plurality of source selection transistors SST switching the connection between a plurality of memory cells belonging to the same string and a ground voltage line SL. The NAND flash memory comprises a plurality of bit lines BLs connected to the drain terminal of the drain selection transistors DST. The NAND flash memory further comprises a plurality of word lines WLs connected to the gate terminal of the memory cells, e.g. the memory cell 200 of FIG. 2. The NAND flash memory further comprises a plurality of drain selection lines DSL, each of these drain selection lines DSLs may be connected to a plurality of drains selection transistors DSTs in the same row. The NAND flash memory 800 further comprises a voltage supplying circuit 825 in turn including a plurality of voltage supplying units (or voltage supplying circuits) 826, 827, 828. One of the voltage supplying units 828 provides a gate voltage to the drain selection transistors DST through the corresponding drain selection line DSL. A second voltage supplying unit 827 provides a gate voltage to a plurality of word lines. A third voltage supplying unit 826 provides a gate voltage to the source selection transistors SST through the source selection line SSL.

In particular, the controller 810 controls the voltage supplying units 826, 827, and 828 so that the gate voltage levels may vary at a specific moment. The controller 810 also controls the bit lines through the sensing circuits (or verify circuits) 820 and the M2e, M2o and M1e, M1o transistors, as indicated in FIG. 8A, so that the bit line connected to the drain selection transistor which has been verified to be programmed during the programming operation of the drain selection transistor DST is provided thereon a predetermined voltage for keeping the drain selection transistor DST in an inhibit state. That is to say, the controller 810 controls the elements of the NAND flash memory to perform the method for programming the selection transistors according to the invention.

The NAND flash memory 800 further comprises a first switch SD switching the connection between the voltage supplying unit 828 and the corresponding drain selection line DSL. Similarly, the NAND flash memory 800 comprises a second switch SW switching the connection between the voltage supplying unit 827 and the corresponding word line WLs. The NAND flash memory 800 further comprises a third switch SS switching the connection between the voltage supplying unit 826 and the corresponding source selection line SSL which is connected to a plurality of the source selection transistors SST.

The NAND flash memory 800 further comprises a bias voltage supplying circuit 815 supplying a bias voltage to the bit lines. The bias voltage supplying circuit 815 may supply a fixed voltage for putting some bit lines in an inhibit state. The NAND flash memory 800 further comprises a first even bit line switch M1e switching the connection between the bias voltage supplying circuit 815 and an even bit line BL0 among the plurality of bit lines, as well as a first odd bit line switch M1o switching the connection between the bias voltage supplying circuit 815 and an odd bit line BL1. This configuration allows to bias even bit lines or odd bit lines to the bias voltage selectively for the inhibit condition. As previously explained, the selected bit lines are biased to the ground voltage and the unselected bit lines is biased to the predetermined higher voltage, e.g. 6V.

The NAND flash memory 800 further comprises a sensing circuit 820 sensing the current flowing from the bit lines BLs (i.e. the circuit 820 verifying whether memory cell and/or selection transistor has been shifted to a program condition). Additionally, the sensing circuit 820 may apply a ground voltage to the bit lines which should be programmed. The NAND flash memory 800 further a second even bit line switch M2e switching the connection between the sensing circuit 820 and the even bit line BL0, and a second odd bit line switch M2o switching the connection between the sensing circuit 820 and the odd bit line BL1.

Figure 8B:
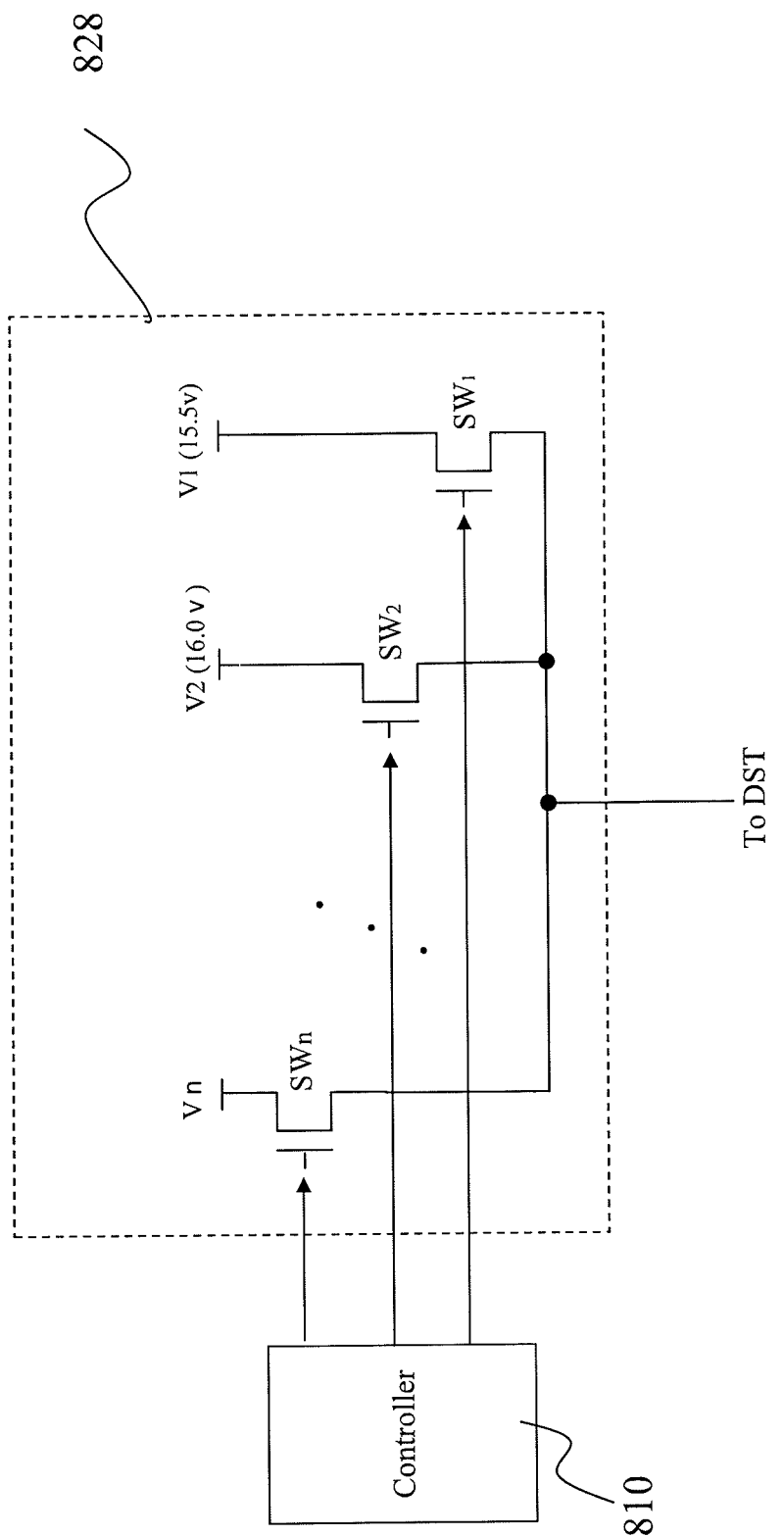
FIG. 8B schematically shows an enlarged view of the voltage supplying circuit used in the NAND flash memory of FIG. 8A.

FIG. 8B schematically shows an enlarged view of the voltage supplying circuit used in the NAND flash memory 800 according to the embodiment of the invention.

The voltage supplying unit (or voltage supplying circuit) 828 may comprise a plurality of switches $SW_1$, $SW_2$, SWn. One terminal of these switches may be connected to the drain selection line, and the other terminal of these switches may be connected to different voltage sources having different voltage level such as $V_1$, $V_2$, and Vn. The controller 810 may control each of the switches so that different voltages can be applied to the drain selection transistor DST in time. An ISPP signal for the programming of the gate can be thus generated by this voltage supplying unit 828.

Advantageously, the method and device for programming the selection transistor improve the precision of the threshold voltage of the selection transistors.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed:

1. A device comprising:
 a non-volatile memory array including a cell and a selection transistor coupled to the cell;
 a first circuit supplying first and second program voltages, the first voltage being supplied to the selection transistor in order to shift the selection transistor to a program condition, the second voltage being supplied to the selection transistor when the selection transistor has not been shifted to the program condition due the supplying of the first voltage, the second voltage being larger than the first voltage;
 a first switch circuit coupled to the first selection transistor; and
 a second circuit coupled to the first switch circuit and supplying one of first and second bias voltages when the first switch circuit is rendered conductive, the first bias voltage being supplied to the selection transistor in order to prevent the selection transistor from being shifted to the program condition, and the second bias voltage being supplied to the selection transistor in order to allow the selection transistor to be shifted to the program condition.

2. The device according to claim 1, further comprising:
 The second switch circuit coupled to the first selection transistor; and
 a third circuit coupled to the second switch circuit and verifying whether the selection transistor has been shifted to the program condition when the second switch circuit is rendered conductive.

* * * * *